(12) United States Patent
Ye et al.

(10) Patent No.: US 7,902,066 B2
(45) Date of Patent: Mar. 8, 2011

(54) DAMASCENE CONTACT STRUCTURE FOR INTEGRATED CIRCUITS

(75) Inventors: Jian Hui Ye, Sunnyvale, CA (US); Mei Sheng Zhou, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 362 days.

(21) Appl. No.: 11/535,069

(22) Filed: Sep. 26, 2006

(65) Prior Publication Data

US 2008/0076244 A1    Mar. 27, 2008

(51) Int. Cl.
*H01L 21/4763* (2006.01)
(52) U.S. Cl. .................. 438/637; 438/675; 257/E21.577
(58) Field of Classification Search .................. 438/637, 438/675, 618; 257/E21.579, E21.577
See application file for complete search history.

(56) References Cited

U.S. PATENT DOCUMENTS

| | | | |
|---|---|---|---|
| 5,187,120 A | 2/1993 | Wang | |
| 5,275,973 A | 1/1994 | Gelatos | |
| 5,360,697 A | 11/1994 | Mehra | |
| 6,174,777 B1 | 1/2001 | Jang | |
| 6,399,511 B2 | 6/2002 | Tang et al. | |
| 6,462,368 B2 | 10/2002 | Torii et al. | |
| 6,576,546 B2 * | 6/2003 | Gilbert et al. | 438/629 |
| 6,624,066 B2 | 9/2003 | Lu et al. | |
| 6,696,222 B2 | 2/2004 | Hsue et al. | |
| 6,893,954 B2 | 5/2005 | Maekawa | |
| 6,911,395 B1 | 6/2005 | Qiao et al. | |
| 6,911,397 B2 | 6/2005 | Jun et al. | |
| 7,015,133 B2 | 3/2006 | Su et al. | |
| 7,022,600 B2 | 4/2006 | Kim et al. | |
| 7,052,621 B2 | 5/2006 | Kumar et al. | |
| 2003/0008490 A1 | 1/2003 | Xing et al. | |
| 2004/0157425 A1 * | 8/2004 | Catabay et al. | 438/597 |
| 2004/0192026 A1 * | 9/2004 | Chen et al. | 438/629 |
| 2005/0006769 A1 * | 1/2005 | Givens et al. | 257/751 |
| 2006/0205207 A1 * | 9/2006 | Chen et al. | 438/638 |

OTHER PUBLICATIONS

L. Castoldi et al., Copper-titanium thin film interaction, Microelectronic Engineering, 2004, 153-159, 76, Elsevier B. V.

* cited by examiner

*Primary Examiner* — Asok K Sarkar
*Assistant Examiner* — Julia Slutsker
(74) *Attorney, Agent, or Firm* — Horizon IP Pte Ltd

(57) ABSTRACT

Interconnects for integrated circuits, such as damascene structures are formed using a hard mask. The hard mask is formed from, for example, high-k dielectric material such as hafnium oxide or other materials having high etch selectivity to the interconnect dielectric material. This enables a thin mask to etch vias and trenches in the interconnect dielectric layer, avoiding the problems associated with the use of thick mask layers, such as contact hole striations and small depth of focus, which can result in shorts or opens.

20 Claims, 15 Drawing Sheets

US 7,902,066 B2

DAMASCENE CONTACT STRUCTURE FOR INTEGRATED CIRCUITS

FIELD OF THE INVENTION

The present invention relates generally to integrated circuits, and more particularly damascene contacts in integrated circuits.

BACKGROUND OF THE INVENTION

The fabrication of integrated circuits (ICs) involves the formation of features on a substrate that make up circuit components, such as transistors, resistors and capacitors. The devices are interconnected, enabling the ICs to perform the desired functions. Interconnections are formed by forming contacts and conductive lines in an interconnecting dielectric layer (ICD) using, for example, damascene techniques. A damascene structure, for example, includes a via or contact hole in a lower portion and a trench which is generally wider than the contact hole in an upper portion. The via serves as a contact to a device while the trench contains the conductive line for connecting the device to, for example, other devices.

To form the features and interconnections, layers are repeatedly deposited on the substrate and patterned as desired using lithographic techniques. Such techniques generally use an exposure source to project an image from a mask onto a photoresist layer formed on the surface of the substrate. The exposure source illuminates the resist layer, exposing it with the desired pattern. Developing the resist exposes portions of the underlying layer, which are removed by etching while the unexposed portions are protected and remain intact.

However, designers are faced with numerous challenges regarding interconnections as technology progresses beyond deep ultraviolet (DUV) lithography (<193 nm). For example, striations in contact holes are a common phenomenon due to softness of resist used in such type of lithography. Striations can result in shorts as well as other problems. Additionally, due to the softer photoresist being used, a larger photoresist budget or thicker photoresist layer is required. This reduces the depth of focus of the lithography, which can result in shorts or opens due to misalignment of the contact holes. These problems decrease critical dimension (CD) control which reduces the process window for forming interconnections, thus lowering yields and increasing manufacturing cost.

From the foregoing discussion, it is desirable to provide improved interconnections in ICs.

SUMMARY OF THE INVENTION

The present invention relates to interconnections in ICs. In one aspect of the invention, a method for forming interconnections is disclosed. The method includes providing a substrate having a contact region and forming a dielectric layer over the substrate. A hard mask layer is deposited over the dielectric layer and patterned. The patterned hard mask is used to etch the dielectric layer to form a contact opening. In one embodiment, the etch leaves a dielectric plug remaining at the bottom of the dielectric layer, covering the contact region. The hard mask is repatterned and used as an etch mask to form trenches in an upper portion of the dielectric layer. The dielectric plug is removed to expose the contact region. The resulting process forms a damascene structure. In another aspect of the invention, the hard mask used to form interconnects has a high etch selectivity to the dielectric layer which reduces thickness of mask layer for forming interconnect structure to produce an increase in CD control.

In yet another aspect of the invention, a method for forming interconnections is disclosed. The method comprises forming an interconnecting barrier which lines a cavity disposed on a substrate. A liner layer is then formed on the substrate over the interconnecting barrier followed by filling the cavity with a conductive material. The substrate is annealed, causing a reaction between the conductive material and liner layer to form a secondary liner layer therebetween. Providing a secondary liner layer advantageously lowers interconnect resistance, improves barrier properties and reduces corrosion of the conductive material.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION OF THE INVENTION

The present invention relates to ICs. More particularly, the present invention relates to interconnections and processes for forming such in ICs. The ICs can be any type of IC, for example dynamic or static random access memories, signal processors, or system on chip devices. In one embodiment, a damascene structure is formed using a hard mask layer. In one embodiment, the hard mask layer is used to form the lower and upper portions of the damascene structure. Alternatively, the hard mask layer can be used to form vias for contact plugs. The use of a hard mask layer reduces the photoresist budget, avoiding problems associated with thick photoresist layers. This increases the process window for forming interconnections which in turn raises yields and lowers manufacturing cost.

Figure 1:
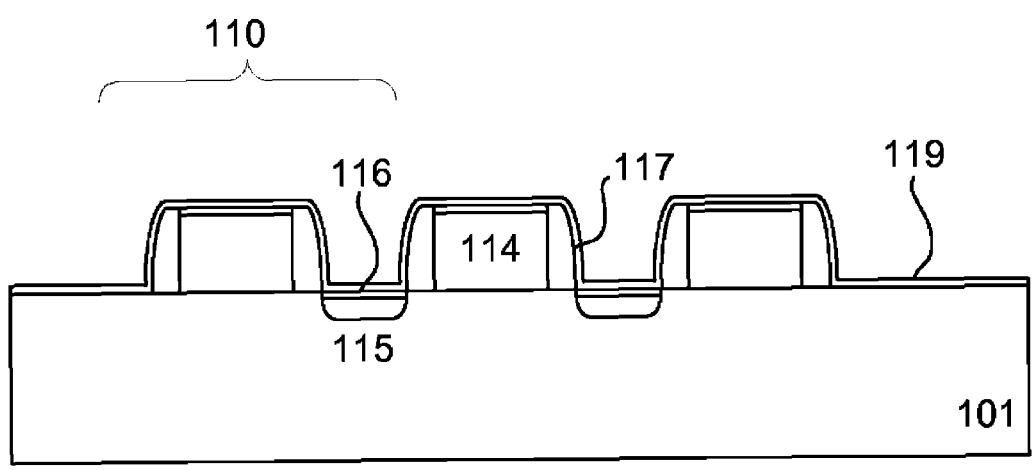
FIGS. 1-11 show a process for forming an interconnection in accordance with one embodiment of the invention.

FIGS. 1-11 show a cross-sectional view of a portion of an integrated circuit (IC) 100 depicting a process for forming interconnections in accordance with one embodiment of the invention. Referring to FIG. 1, a substrate 101 is shown. The substrate is provided with at least one contact region 115. Generally, the substrate includes numerous contact regions. The contact region can include any type of contact region. For example, the contact region could be a contact to the gate, source, or drain of a transistor, a doped region on a substrate, a metal line, or an electrode of a device, such as a capacitor. The contact region can be located at different interconnect levels, including the surface of the semiconductor substrate. It is understood that the term substrate can refer to different surfaces of the integrated circuit, for example, forming interconnects for different metal levels.

The IC, as shown, is processed to include transistors 110 on the surface of the substrate. The substrate, in this example, is a semiconductor substrate. Typically, the semiconductor substrate comprises a lightly doped p-type silicon substrate. Other types of substrates are also useful, depending on the application. The substrate can be, for example, a germanium-based, gallium arsenide, silicon-on-insulator (SOI), or sapphire substrate. A transistor includes a gate 114, and electrodes 115. Adjacent transistors can be arranged to share a common electrode. The gate can be formed as gate conductors, serving, for example, as word lines. Forming individual gates is also useful. The electrodes correspond to source/drain regions. Silicide contacts 116 can be provided on the electrodes to lower contact resistance. Dielectric sidewall spacers 117 can be provided on the side of the transistor gates. A barrier layer 119 which can also serve as an etch stop is provided, covering the transistor and substrate. Typically, the barrier layer comprises silicon nitride. Other types of barrier materials are also useful to serve as the barrier layer. To isolate devices, isolation regions (not shown) comprising, for example, silicon oxide can be provided. Preferably, the isolation regions comprise shallow trench isolations (STIs). Other types of isolation regions or materials can also be useful.

Figure 2:
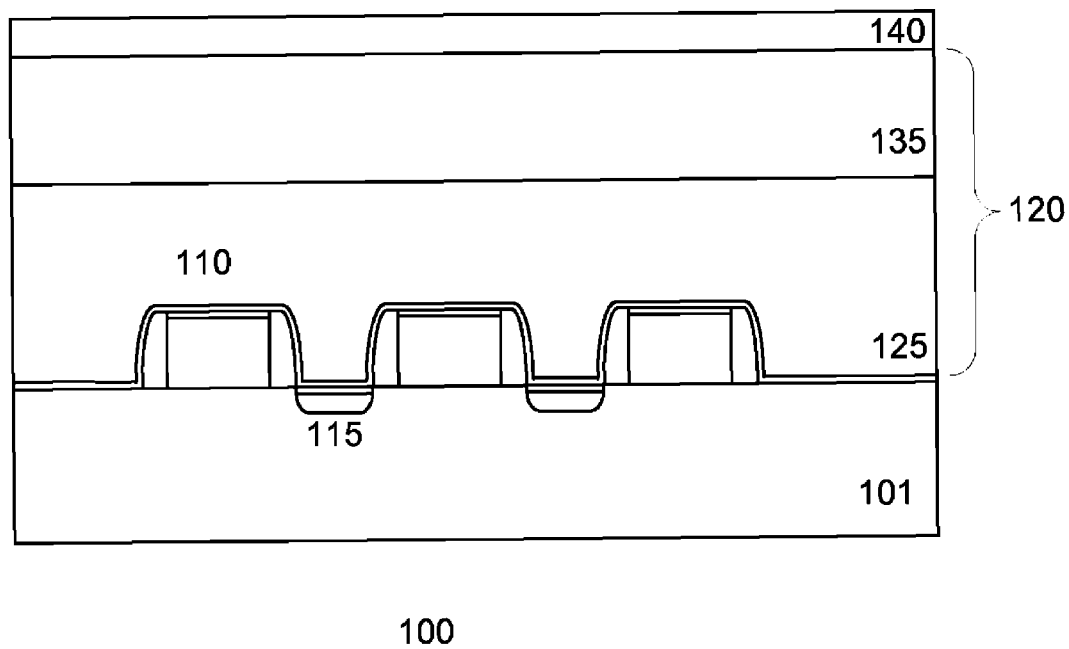

In FIG. 2, an ICD stack 120 is formed over the substrate, covering the barrier layer and transistors. In one embodiment, the ICD stack comprises first and second dielectric layers 125 and 135 formed sequentially on the substrate. The first dielectric layer is referred to as the interlevel dielectric (ILD) layer while the second dielectric layer is referred to as the intrametal dielectric (IMD) layer. In one embodiment, the ILD layer comprises a dielectric material, such as silicon dioxide. Other types of dielectric materials including doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and other low-k or ultra low-k dielectric materials can also be used to form the ILD layer. The IMD layer preferably comprises a low-k dielectric material, such as organo-silicate glass (OSG), FSG, or other low-k or ultra low-k dielectrics. Other types of dielectric materials are also useful to serve as the IMD layer. The thickness of the ILD and IMD layers should be about equal to the height of the via and trench, respectively, of the damascene contact structure. In one embodiment, the ILD and IMD layers are each about 2000-20,000 Å thick. Other thicknesses are also useful, for example, depending on the desired height of the contact plug and interconnecting lines. Further, it is understood that the thickness of the layers can be the same or different.

The ICD layers can be deposited using various types of chemical vapor deposition (CVD) processes such as plasma enhanced (PECVD), high density (HDCVD), atmospheric pressure (APCVD) as well as spin-on processes, depending on the type of material used and application. A chemical mechanical polish (CMP) or etch back process can be performed, if necessary, on either or both of the layers to provide planar top surfaces.

In accordance with one embodiment of the invention, a hard mask 140 is formed above the ICD stack. The hard mask comprises a material having sufficiently high selectivity to the materials of the ICD stack using the appropriate etch chemistry. In one embodiment, the etch selectivity between the hard mask and ICD stack is about 20-100, and preferably greater than about 50. Effectively no hard mask material is lost from forming the upper and lower portions of the damascene contact structure. This enables the use of significantly thinner masks which improves CD control. The appropriate thickness of the hard mask depends on the materials used. The hard mask, in one embodiment, comprises a thickness ranging from about 100-5000 Å. Preferably, the hard mask comprises a thickness of about 500 Å.

In one embodiment, the hard mask comprises a high-k dielectric material. The high-k dielectric material comprises, for example, hafnium or zirconium containing compounds. Such compounds include, for example, hafnium oxide ($HfO_2$), hafnium silicate compounds like $Hf_xSi_yO_z$ and $Hf_xSi_yO_zN$ silicate, zirconium oxide ($ZrO_2$), $Zr_xSi_yO_z$, $Al_2O_3$, $Ti_xSi_yO_z$, $Al_xSi_yO_z$, Ti, TiN, $TiO_2$, Ta, TaN, W, WN or a combination thereof. In one embodiment, the hard mask comprises $HfO_2$ or TiN. Other types of hard mask materials, including conductive and non-conductive materials, such as N+ or P+ doped polysilicon or silicon carbide (SiC), metals, silicon oxide, silicon nitride, silicon oxynitride, are also useful. The hard mask is formed using conventional deposition processes, such as CVD, physical vapor deposition (PVD), sputtering, thermal oxidation, and the like.

Figure 3:
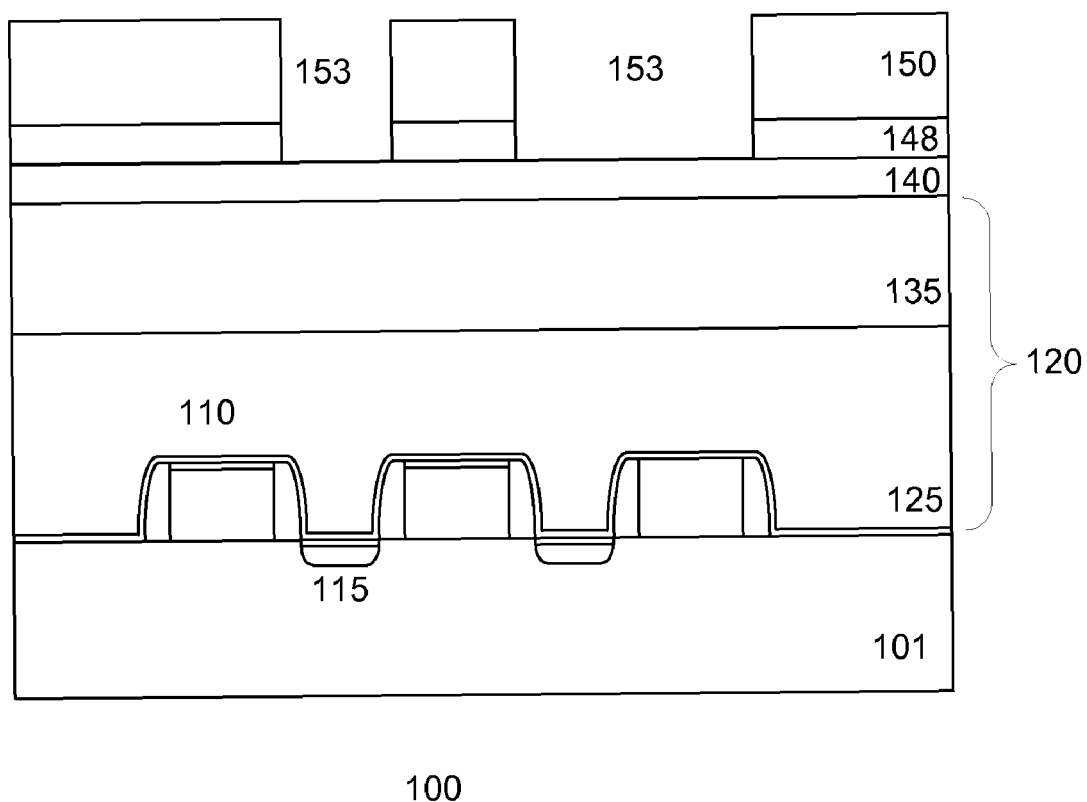

Referring to FIG. 3, soft mask layer 150 is formed over the hard mask. In one embodiment, the soft mask layer comprises photoresist. A bottom antireflective coating (BARC) 148 can be formed above the hard mask and ICD stack to reduce substrate reflectivity. The BARC can comprise an organic or inorganic material and be formed by appropriate techniques, such as spin-on, sputtering or CVD. In one embodiment, the BARC comprises an organic material formed by a spin-on process.

The soft mask is patterned to form openings 153 corresponding to contact regions. Conventional lithographic and patterning processes can be employed to pattern the soft mask. For example, the photoresist is exposed to an exposure source with the desired pattern and developed to remove desired portions to form the openings. Portions of the BARC exposed by patterning the soft mask are also removed. Depending on the type of BARC used, the exposed portions can be removed in the resist development process or separately.

Figure 4:
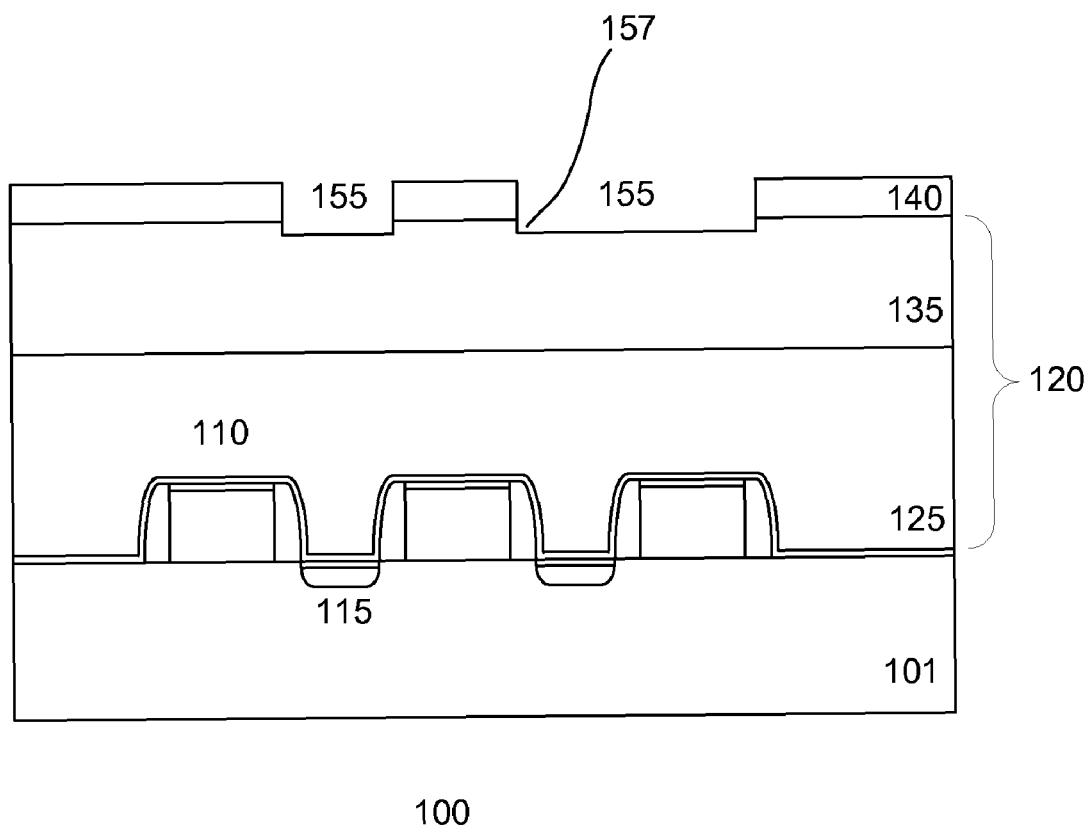

As shown in FIG. 4, the hard mask is patterned, removing portions 155 exposed by the patterned soft mask/BARC. In one embodiment, the hard mask is patterned selective to the ICD stack. The hard mask is patterned using, for example, an anisotropic etch, such as dry or reactive ion etching (RIE) with appropriate etch chemistry, for example, chlorine-based ($Cl_2$) chemistry. High etch selectivity between the hard mask and ICD stack, for example greater than about 50, can be obtained. Other types of etch chemistry can also be employed to selectively etch the hard mask. The etch chemistry employed may depend on the hard mask and ICD materials. For example, fluorocarbons such as $CF_4$, $C_xF_y$ or $C_xH_yF_z$ may be added to the etching gas when the hard mask comprises silicon nitride. In one embodiment, an over etch is performed to ensure that the surface of the ICD stack is exposed. This results in the formation of notches 157 on the surface of the ICD stack. After the hard mask is patterned, the soft mask and BARC are removed by conventional techniques, such as plasma ash or wet etching.

Figure 5:
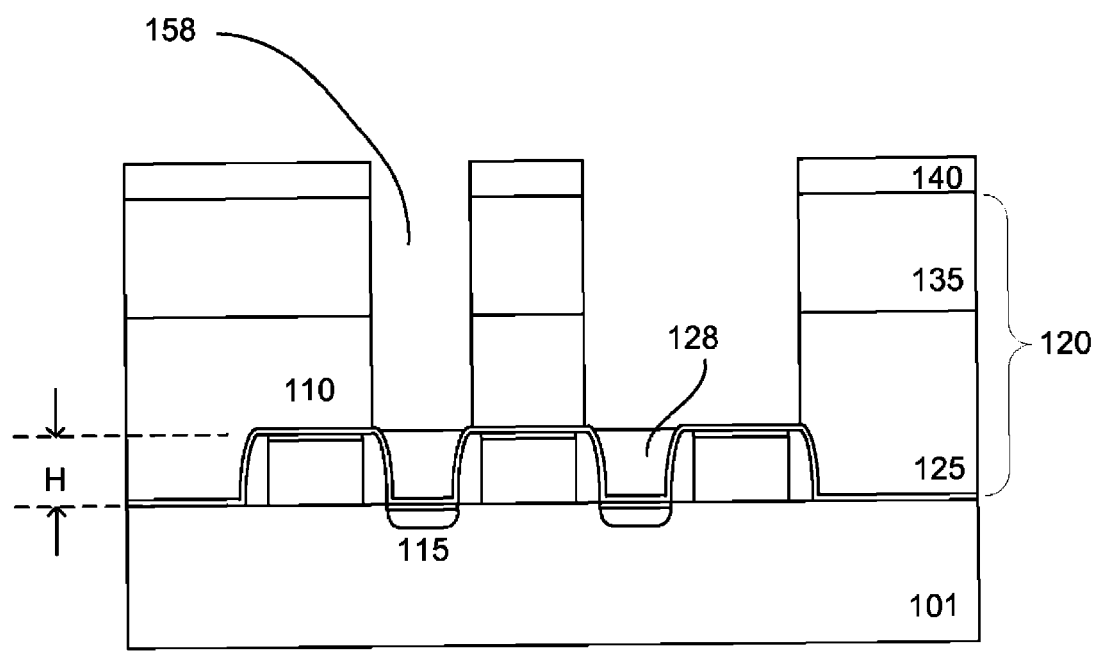

In FIG. 5, the ICD stack is dry etched, with the hard mask layer serving as the etch mask. The etch selectively removes exposed portions of the ICD stack unprotected by the hard mask to form via 158. A fluorocarbon (e.g., $C_4F_6$) etch chemistry is employed for etching the ICD stack. Other types of etch chemistry which can effectively etch the ICD materials selective to the hard mask can also be used. In one embodiment, the etch substantially removes the exposed portions of the ICD stack, leaving a lower portion or plug 128 of the ICD stack covering the contact region 115. The plug comprises a height H. In one embodiment, H is equal to about the height of the transistors. For example, H is equal to about 1000-5000 Å. Other values for H are also useful.

Figure 6:
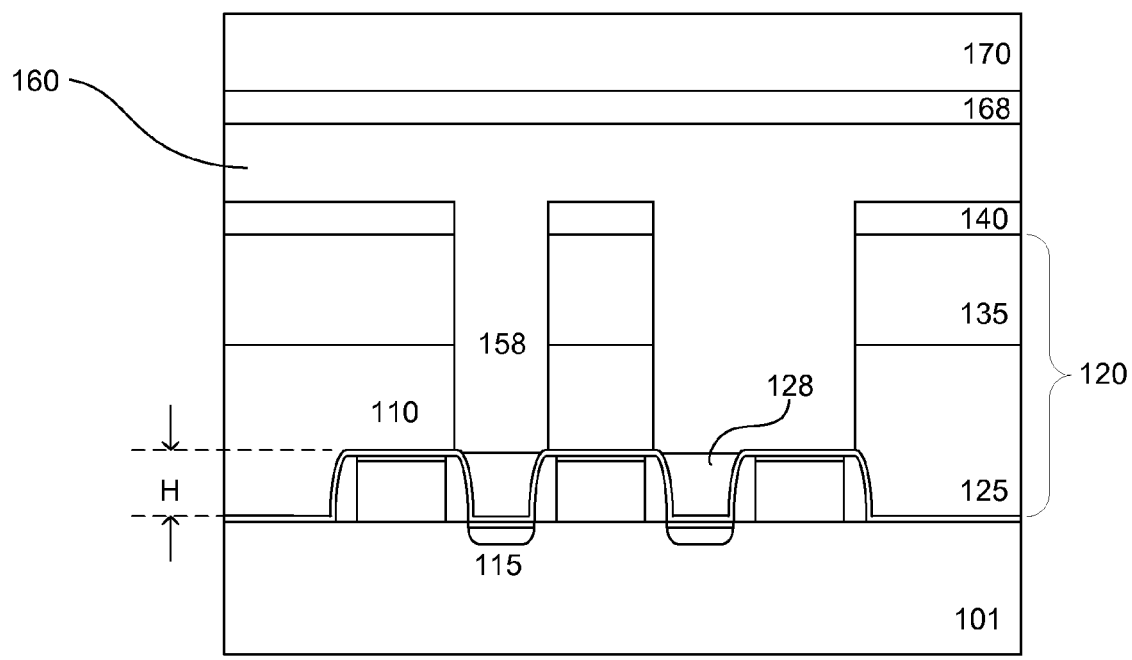

Referring to FIG. 6, a sacrificial layer 160 is deposited on the substrate, filling the vias and covering the substrate surface (e.g., hard mask). The sacrificial layer, for example, comprises a commercial polymeric material. Various types of polymeric materials can be used, for example, EXP03049 from Nissan Chemical. Other types of materials which can be etched selectively to the hard mask and ICD stack can also be used. A CMP or etch back process can be performed, if necessary, to provide excess sacrificial layer above the hard mask with a planar surface. Alternatively, excess sacrificial layer above the hard mask is removed, leaving a planar surface defined by the top of the hard mask. BARC and photoresist layers 168 and 170, in one embodiment, are sequentially formed over the sacrificial layer.

Figure 7:
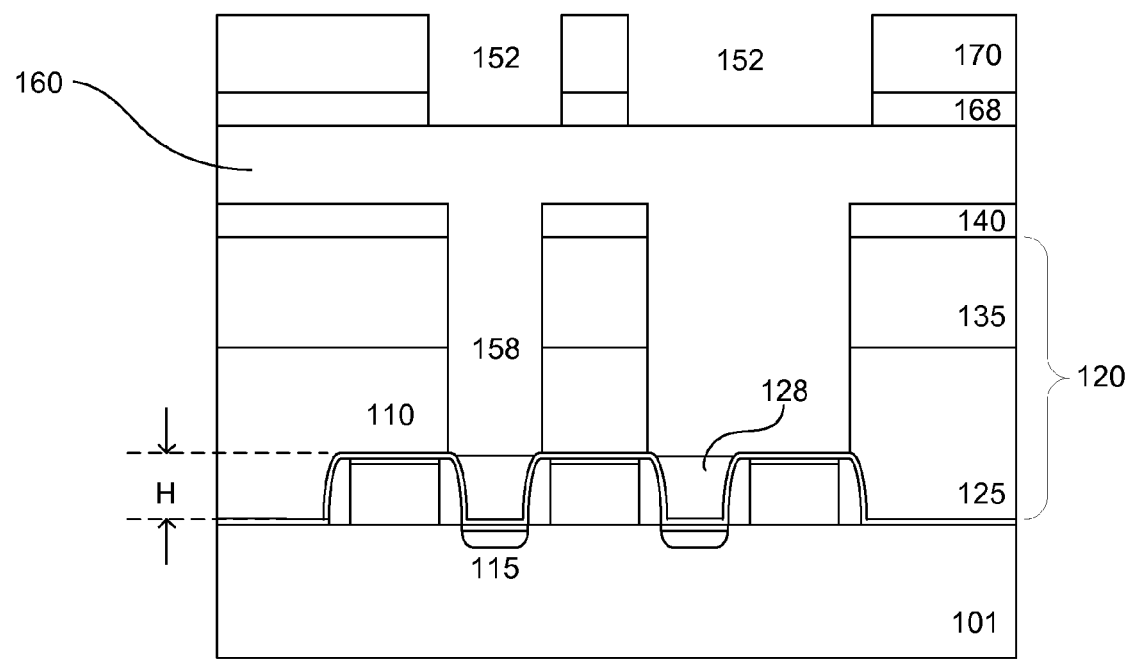
Figure 8:
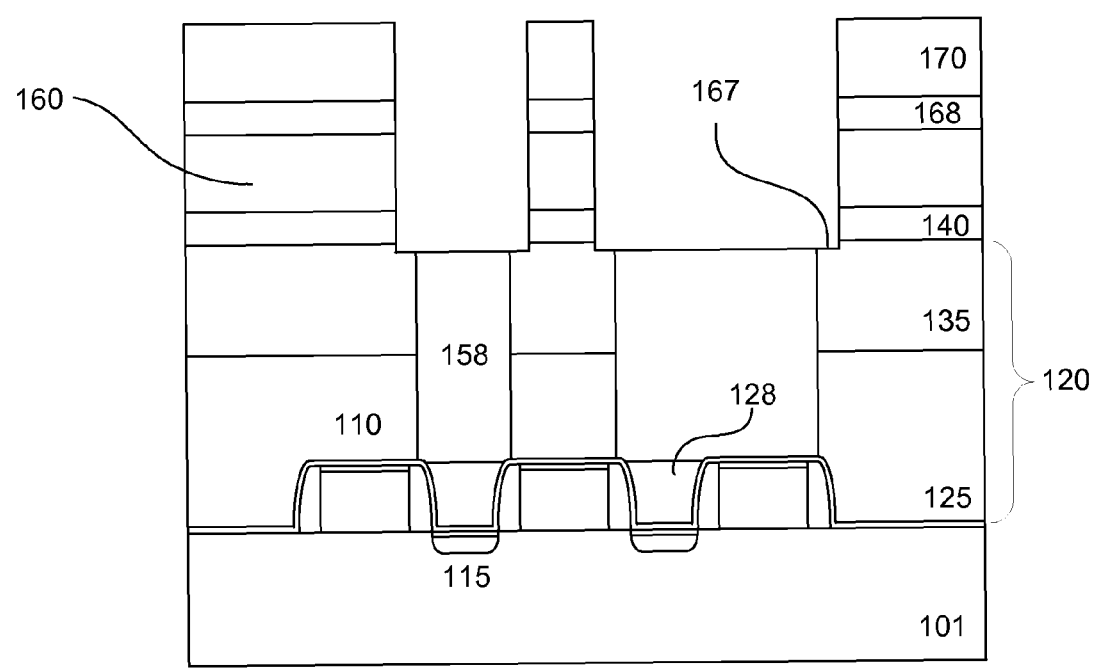

The BARC and photoresist layers are patterned, creating openings 152 as shown in FIG. 7. The openings correspond to the pattern of trenches to be formed. With the photoresist serving as a mask, the hard mask layer is re-patterned. FIG. 8 shows removal of exposed portions of the hard mask and sacrificial material. In one embodiment, the hard mask is over-etched to ensure exposure of the ICD stack. Over-etching forms notches 167 on the surface of the ICD stack. After the hard mask is patterned, the photoresist and BARC as well as excess sacrificial layer (if present) are removed.

Figure 9:
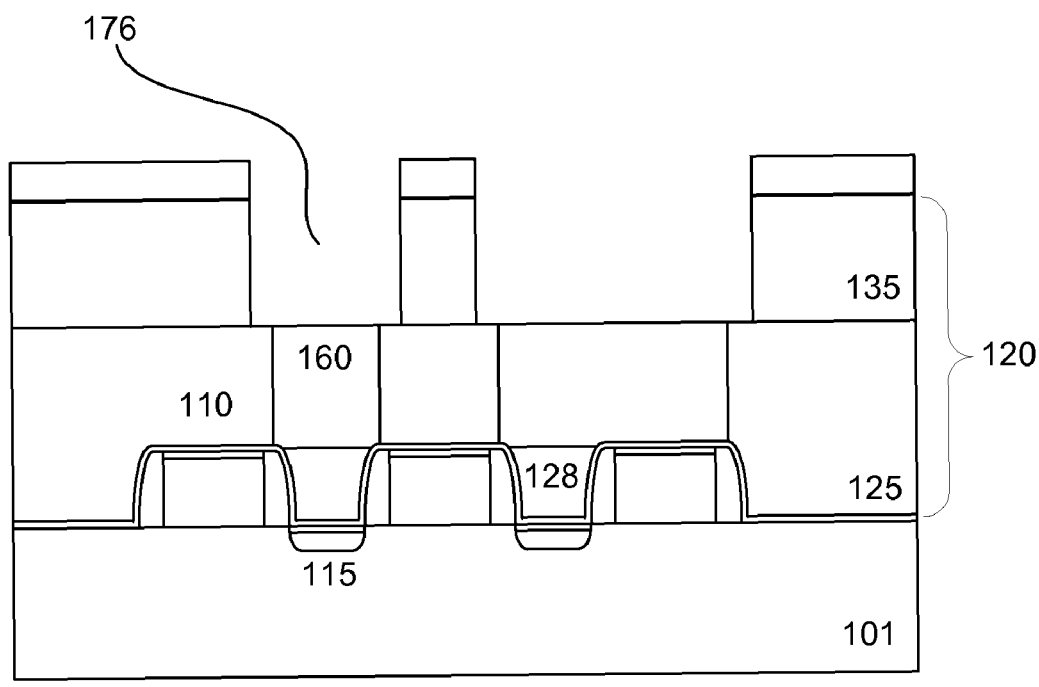
Figure 10:
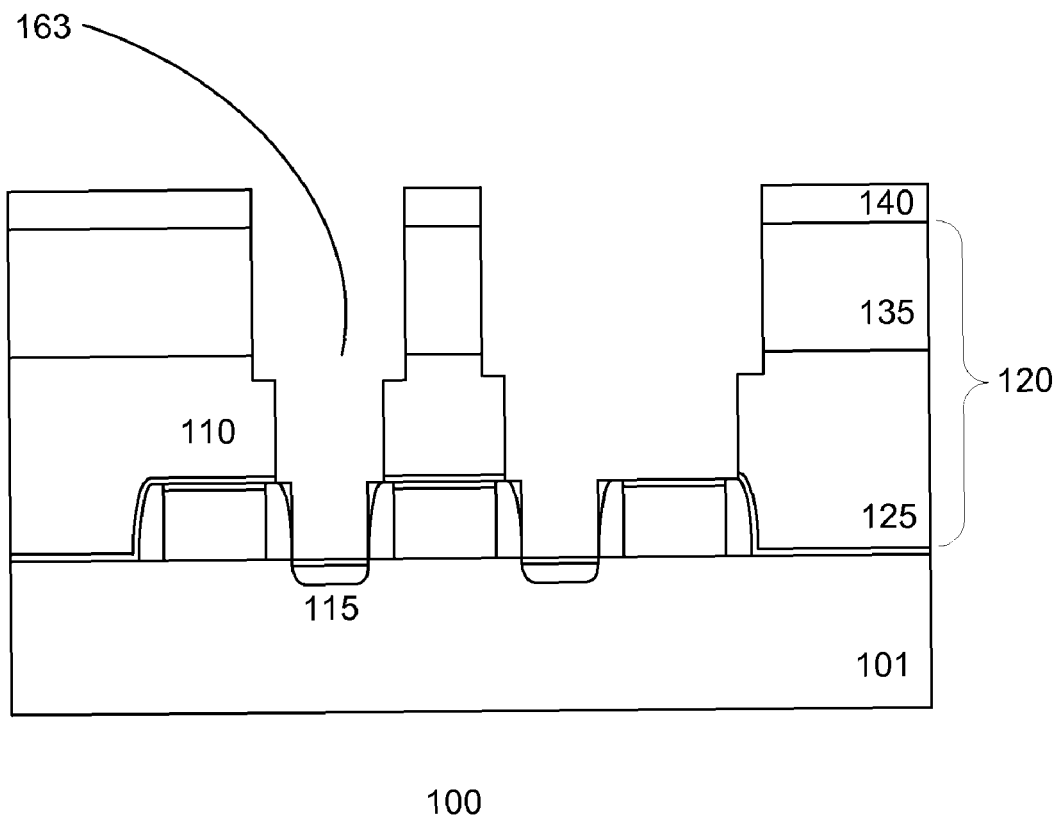

Referring to FIG. 9, a dry etch is performed to form trenches 176 in the ICD layer while leaving sacrificial material covering the plug in the via. In one embodiment, the sacrificial material and the ICD layer are etched together to form the trenches. The etch chemistry, in one embodiment, comprises fluorocarbons (e.g., $C_4F_6$). Other types of etch chemistry which can etch the sacrificial material and the ICD layers selective to the hard mask are also useful. The process continues by removing the sacrificial material, plug and surface of the liner to expose the contact region, as shown in FIG. 10. At this point, the damascene structure is formed.

The composition and/or ratio of the etching gas can be tailored to adjust the etch selectivity at different stages of the dry etch, for example, to avoid fencing. In one embodiment, the same etch chemistry is used to remove the sacrificial layer, plug and liner. Gas composition is adjusted to optimize etch selectivity at each stage. Alternatively, different etch chemistries can be used to remove the respective layers.

Note that the bottom of the trench 163 is recessed in the process of clearing the via due to the lack of etch selectivity. In one embodiment, the etch process for forming the trench takes into account the secondary etching by forming a shallower than desired trench. For example, the initial trench etch forms a trench having a depth which is about 80-90% of the desired depth. Other initial depths may also be useful, depending on the height of the plug. Additionally, the patterning of the hard mask and ICD layers can be combined into a single patterning step. This can be achieved by, for example, using an in-situ ash process in between to strip off the BARC and resist layers.

Figure 11:
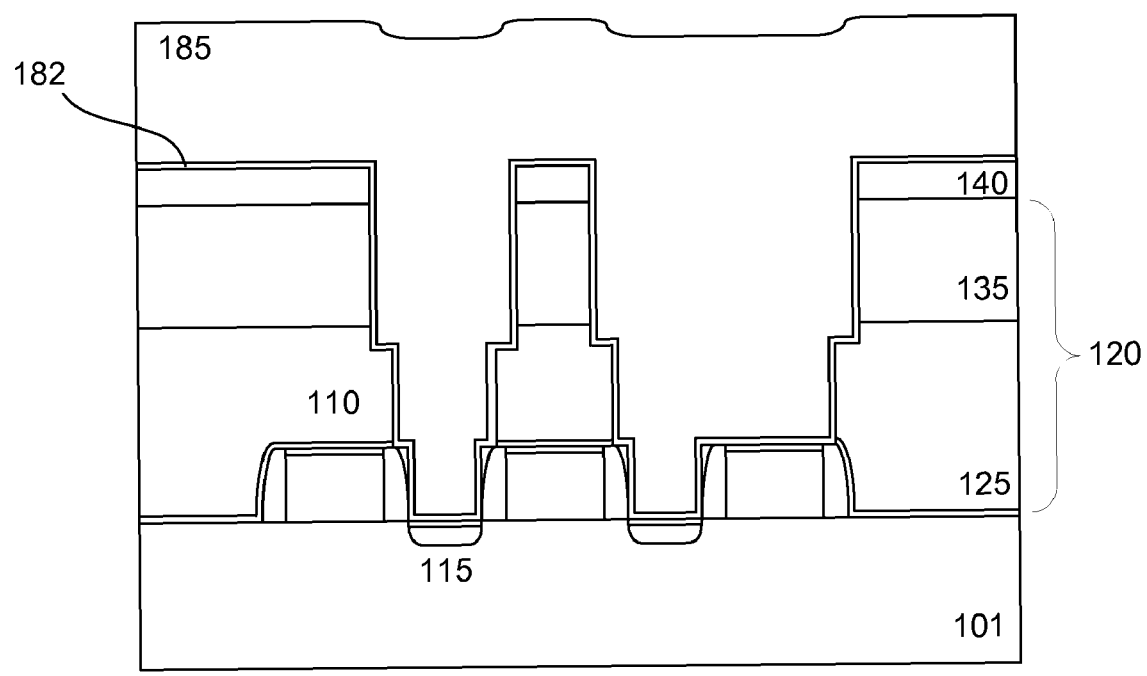
Figure 12:
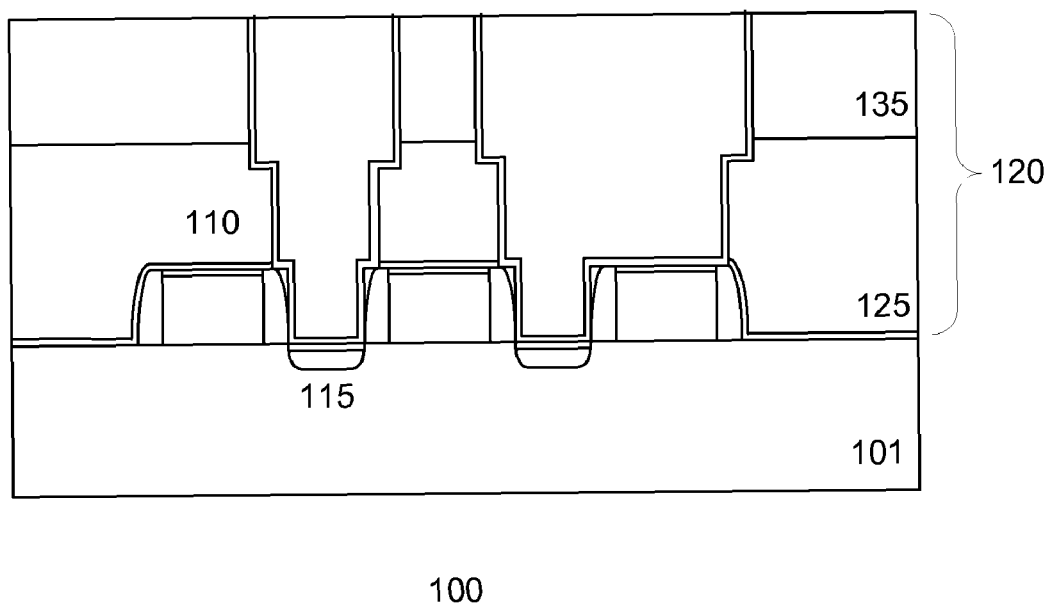
FIGS. 12-15 show interconnections in accordance with various embodiments of the invention.

Referring to FIG. 11, the process continues by filling the damascene structure with a conductive material. In one embodiment, the damascene structure is filled with copper (Cu). Other types of conductive materials, such as aluminum and tungsten, are also useful. For Cu applications, a conductive barrier 182 layer is deposited over the substrate, covering the hard mask and lining the inner surfaces of the damascene structure. The barrier, for example, comprises titanium, tantalum, nitrides thereof, or combination thereof. Other barrier materials such as nitrides of transitional metal are also useful. The barrier layer is formed by, for example, CVD or PVD. Once the barrier is formed, a Cu seed layer is deposited, lining the barrier. The Cu seed layer is formed by, for example, sputtering. A Cu layer 185 is then deposited on the substrate by, for example, electroplating or other electromechanical techniques. The Cu layer fills the damascene structure, with excess material covering the substrate surface. In FIG. 12, the substrate is polished by CMP to remove excess material on the surface, completing the formation of the interconnects. The hard mask is removed by the CMP. For non-conductive hard masks, the hard mask may remain as part of the structure.

Figure 13:
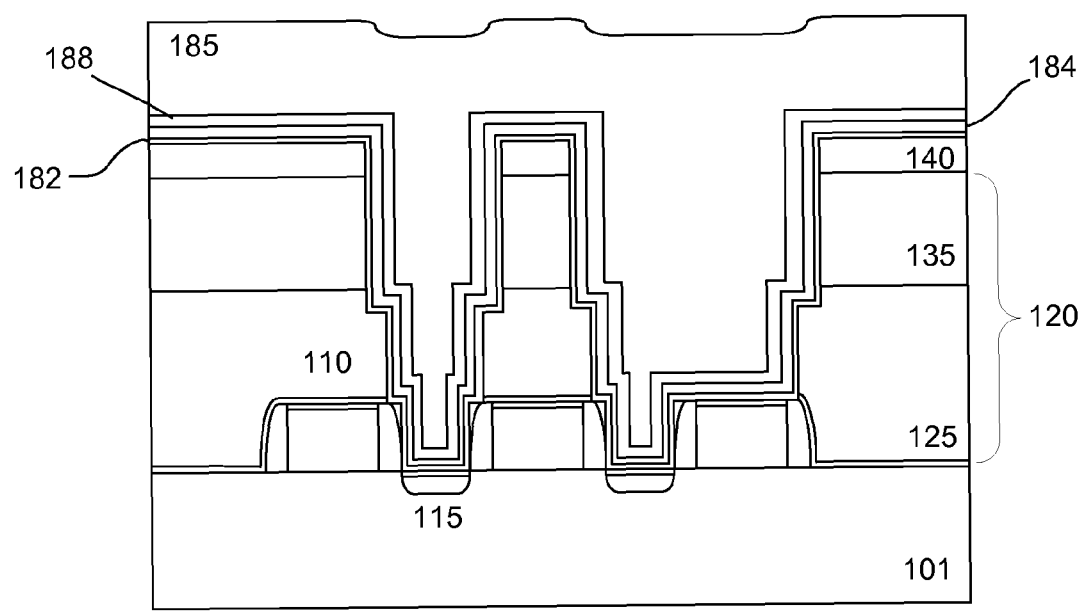

FIG. 13 shows an alternative embodiment of the process for filling the damascene structure with a conductive material. A barrier layer 182 comprising, for example, TiN or other transitional metal nitrides is deposited on the substrate. Other types of barrier materials may also be useful. The barrier lines the surface of the hard mask and inner surface of the damascene structure. A conductive liner layer 184 is formed over the barrier layer. In one embodiment, the liner layer comprises tungsten (W). Other types of materials, such as tungsten nitride (WN), Ti, tantalum (Ta) and tantalum nitride (TaN), may also be used. The liner layer forms a diffusion barrier layer for the Cu interconnect. The thickness of the liner layer is about 200 Å. Other thicknesses may also be useful.

A conductive layer 185 is then deposited on the substrate. In one embodiment, the conductive layer comprises Cu and is deposited, as previously described, filling the damascene structure and covering the substrate surface. The substrate is annealed to form a secondary liner layer 188. The secondary liner layer is formed by a reaction between the liner layer and conductive layer. For copper liner applications, the second liner layer comprises a copper-tungsten (CuW) layer 188. Various types of anneals, such as thermal, rapid thermal (RTA) microwave, or laser, can be used. In one embodiment, the anneal forms a secondary liner layer of about 50-300 Å. The secondary liner layer lowers interconnect resistance and acts as a diffusion barrier between the liner (W) and conductive (Cu) layers. The presence of the CuW layer, which is in a low energy or stable state, also eliminates the potential difference at the Cu—W interface, which may otherwise accelerate corrosion of the Cu layer. The secondary liner layer may also be useful in other applications, such as back-end-of-line (BEOL) trench etch or non-copper interconnects or contacts. After formation of the CuW layer, the process continues as described in FIG. 12.

Figure 14:
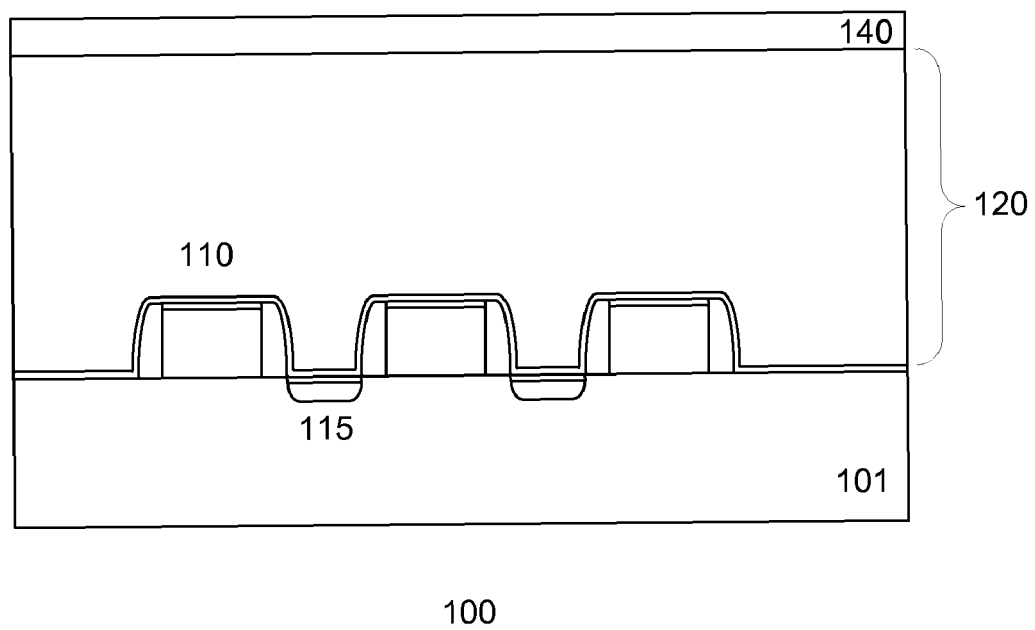
Figure 15:
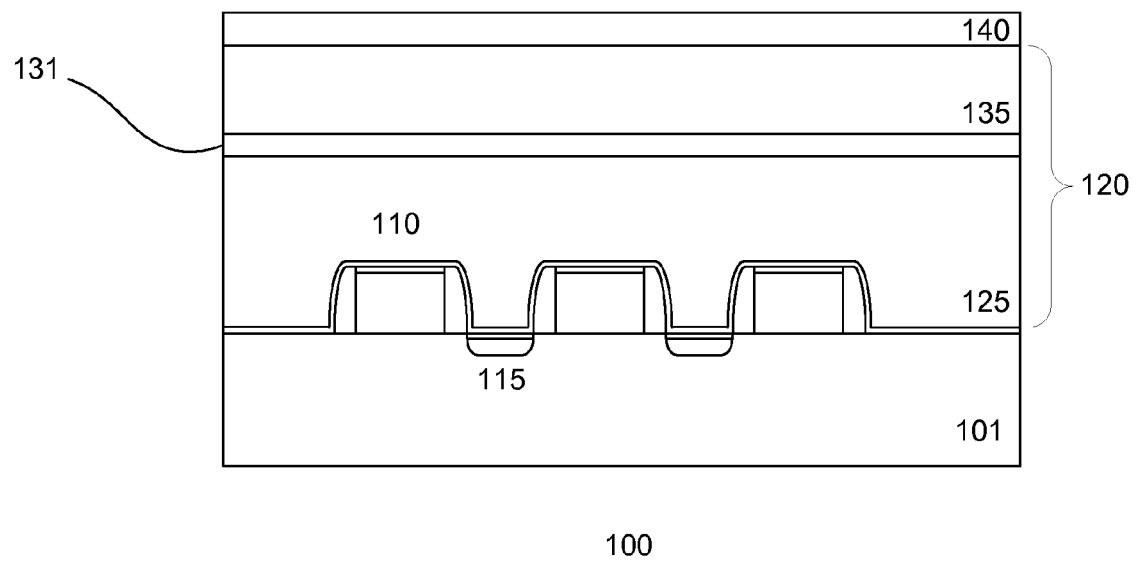

FIGS. 14-15 show the IC employing ICD stacks in accordance with different embodiments of the invention. The ICD stack 120 can comprise a single dielectric layer, as shown in FIG. 14. The ICD stack can be formed from various types of dielectric material, such as silicon oxide, doped or undoped silicate glass, or low-k or ultra low-k dielectrics. Preferably, the ICD stack comprises silicon oxide or low-k dielectrics.

Referring to FIG. 15, an alternative ICD stack 120 having an etch stop 131 separating the ILD 125 and IMD 135 is shown. The etch stop can comprise various insulating material which can serve as an etch stop for IMD etch. For example, materials such as $SiO_2$, SiC, SiN, SRO, SiON, or the like can be used. As for the ILD and IMD, they can be formed from various dielectric materials already discussed. In one embodiment, the ILD and IMD comprise different types of dielectric materials. For example, the ILD layer comprises FSG while the IMD comprises a low-k dielectric material. Forming the ILD and IMD from the same material is also useful. Providing the ILD layer with an etch stop results in better control of trench depth.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of fabricating an integrated circuit comprising:
   providing a semiconductor substrate prepared with a transistor;
   forming an interconnecting dielectric layer (ICD) including first and second dielectric layers on the substrate, wherein the first dielectric layer is an interlevel dielectric (ILD) and the second dielectric layer comprises an intermetal dielectric (IMD);
   forming a hard mask over the second dielectric layer;
   patterning the hard mask to form a contact opening;
   etching the ICD layer using the hard mask as an etch mask to form a via of a dual damascene contact opening, wherein the first dielectric layer is partially etched to leave a dielectric plug in the via to cover a contact region of the transistor;
   forming a sacrificial layer over the substrate which fills the via and covers a surface of the hard mask;
   repatterning the hard mask to form a trench opening;
   patterning the ICD layer to form a trench of the dual damascene contact opening and to expose the contact region of the transistor; and
   forming a metal interconnect in the dual damascene structure.

2. The method of claim 1 wherein the hard mask is deposited using chemical vapor deposition.

3. The method of claim 1 wherein the hard mask comprises $HfO_2$, $ZrO_2$, $TiO_2$, $Al_2O_3$, $HfSiO_x$, $ZrSiO_x$, $TiSiO_x$, $AlSiO_x$, Ti, TiN, Ta, TaN, W, or WN.

4. The method of claim 1 wherein patterning the hard mask and etching the ICD layer to form the via can be combined into one dry etch using in-situ ash step in between to strip off polymers.

5. The method of claim 1 wherein repatterning the hard mask and patterning the ICD layer to form the trench can be combined into one dry etch using in-situ ash step in between to strip off polymers.

6. The method of claim 1 wherein a barrier is deposited on inner walls of the dual damascene structure by physical vapor deposition.

7. The method of claim 1 wherein forming the metal interconnect forms copper interconnect comprises:
   forming a copper barrier on the inner walls of the dual damascene structure;
   filling the dual damascene structure with copper; and
   polishing to remove excess copper to form a planar top surface with surface of the ICD by chemical mechanical polishing.

8. The method of claim 1 wherein forming the metal interconnect comprises:
   forming a barrier layer lining the sidewalls of the dual damascene structure;
   forming a liner layer lining the barrier layer, the liner layer comprising tungsten;
   filling the dual damascene structure with copper;
   annealing the substrate to form copper tungsten barrier between the liner layer and the copper.

9. The method of claim 8, wherein the liner layer further comprises a secondary material including nitride, Ti, TiN, Ta, or TaN.

10. The method of claim 8 wherein the annealing comprises high temperature anneal, laser anneal or microwave anneal.

11. A method for forming interconnections in an IC comprising:
    providing a substrate having a contact region of a transistor;
    forming a dielectric layer over the substrate;
    depositing and patterning a hard mask layer on the dielectric layer;
    partially etching the dielectric layer using the patterned hard mask, wherein partially etching forms a via of a dual damascene opening while leaving a dielectric plug formed from the dielectric layer at a lower portion of the via covering the contact region, the dielectric plug comprises the same material as the dielectric layer;
    forming a sacrificial layer over the substrate to fill the via;
    repatterning the patterned hard mask; and
    etching the dielectric layer using the repatterned hard mask to form a trench of the dual damascene opening in an upper portion of the dielectric layer and removing the dielectric plug to expose the contact region.

12. A method for forming interconnections in an IC comprising:
    providing a substrate having a contact region of a transistor and a dielectric layer over the substrate in which an interconnection is formed to the contact region;
    depositing a hard mask, the hard mask having a high etch selectivity to the dielectric layer which enables a reduction in thickness of a mask layer used for forming interconnect structure to produce an increase in CD control; and
    forming a dual damascene structure in the dielectric layer with the hard mask as an etch mask, wherein forming the dual damascene structure comprises
       partially patterning the dielectric layer to form a via with a dielectric plug leaving to cover the contact region, the dielectric plug comprises the same material as the dielectric layer,
       forming a sacrificial layer over the substrate to fill the via, and
       patterning the dielectric layer to form a trench in an upper portion of the dielectric layer and removing the plug to expose the contact region.

13. A method for forming interconnections comprising:
    providing a substrate having a contact region of a transistor and a dielectric layer over the substrate in which an interconnection is formed to the contact region;
    depositing a hard mask, the hard mask having a high etch selectivity to the dielectric layer which enables a reduction in thickness of a mask layer used for forming interconnect structure to produce an increase in CD control; and
    forming a dual damascene structure in the dielectric layer with the hard mask as an etch mask, wherein forming the dual damascene structure comprises
       partially patterning the dielectric layer to form a via with a dielectric plug leaving to cover the contact region,
       forming a sacrificial layer on the substrate to fill the via and surface of the hard mask, and
       patterning the dielectric layer to form a trench in an upper portion of the dielectric layer and removes the plug to expose the contact region.

14. The method of claim 13 wherein the hard mask comprises $HfO_2$, $ZrO_2$, $TiO_2$, $Al_2O_3$, $HfSiO_x$, $ZrSiO_x$, $TiSiO_x$, $AlSiO_x$, Ti, TiN, Ta, TaN, W, or WN.

15. The method of claim 13 wherein the dielectric plug comprises a height (H) equal to about a height of the transistor.

16. The method of claim 11 wherein the hard mask comprises $HfO_2$, $ZrO_2$, $TiO_2$, $Al_2O_3$, $HfSiO_x$, $ZrSiO_x$, $TiSiO_x$, $AlSiO_x$, Ti, TiN, Ta, TaN, W, or WN.

17. The method of claim 11 wherein the dielectric plug comprises a height (H) equal to about a height of the transistor.

18. The method of claim 12 wherein the hard mask comprises $HfO_2$, $ZrO_2$, $TiO_2$, $Al_2O_3$, $HfSiO_x$, $ZrSiO_x$, $TiSiO_x$, $AlSiO_x$, Ti, TiN, Ta, TaN, W, or WN.

19. The method of claim 12 wherein the dielectric plug comprises a height (H) equal to about a height of the transistor.

20. The method of claim 12 wherein forming the dual damascene structure further comprises forming a sacrificial layer on the substrate to fill the via and surface of the hard mask.

* * * * *